(12) United States Patent
Chen

(10) Patent No.: US 10,764,990 B1
(45) Date of Patent: Sep. 1, 2020

(54) HEAT-DISSIPATING MODULE HAVING AN ELASTIC MOUNTING STRUCTURE

(71) Applicant: ADLINK TECHNOLOGY INC., New Taipei (TW)

(72) Inventor: Hua-Feng Chen, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/391,963

(22) Filed: Apr. 23, 2019

(51) Int. Cl.
| | |
|---|---|
| *H05K 7/02* | (2006.01) |
| *H05K 7/10* | (2006.01) |
| *H05K 7/20* | (2006.01) |
| *H01L 23/34* | (2006.01) |
| *H01L 23/40* | (2006.01) |
| *H01L 23/367* | (2006.01) |
| *H01L 23/467* | (2006.01) |
| *H05K 1/02* | (2006.01) |
| *H05K 7/14* | (2006.01) |

(52) U.S. Cl.
CPC ........... *H05K 1/021* (2013.01); *H05K 1/0209* (2013.01); *H05K 1/0271* (2013.01); *H05K 7/1407* (2013.01)

(58) Field of Classification Search
CPC ... H05K 7/02; H05K 7/10; H05K 7/20; H01L 23/34; H01L 23/40; H01L 23/367; H01L 23/467; H01L 23/4093
USPC ........ 361/715, 697, 709; 349/149; 165/80.3, 165/121, 185; 411/107, 183, 190, 352, 411/353, 372
See application file for complete search history.

(56) References Cited

U.S. PATENT DOCUMENTS

| | | | | |
|---|---|---|---|---|
| 4,963,886 A | * | 10/1990 | Fukuda | B41J 2/345 347/209 |
| 6,498,724 B1 | * | 12/2002 | Chien | H01L 23/467 257/713 |
| 7,064,957 B1 | * | 6/2006 | Liang | H01L 23/4006 361/719 |
| 7,170,165 B2 | * | 1/2007 | Berto | H01L 23/4006 165/185 |
| 7,344,345 B2 | * | 3/2008 | Aukzemas | F16B 5/0241 411/183 |
| 7,474,532 B1 | * | 1/2009 | Desrosiers | H01L 23/4006 165/185 |
| 7,796,390 B1 | * | 9/2010 | Cao | H01L 23/4006 165/80.3 |
| 2002/0121358 A1 | * | 9/2002 | Lee | H01L 23/3672 165/80.3 |
| 2003/0063247 A1 | * | 4/2003 | Kalyandurg | G02F 1/133385 349/149 |

(Continued)

*Primary Examiner* — Xiaoliang Chen

(74) *Attorney, Agent, or Firm* — Muncy, Geissler, Olds & Lowe, P.C.

(57) ABSTRACT

A heat-dissipating module having an elastic mounting structure includes a carrier circuit board, a main circuit board, a heat dissipating module, and a plurality of elastic mounting components configured to mount mounting holes of the carrier circuit board and mounting grooves of the heat dissipating module in series, so as to fix the carrier circuit board, the main circuit board and the heat dissipating module. As a result, the plurality of elastic mounting components can provide stress buffer and good bonding effect for the thermally conductive device of the heat dissipating module bonded on an upper surface of the heat source device.

10 Claims, 5 Drawing Sheets

(56) References Cited

U.S. PATENT DOCUMENTS

| | | | | |
|---|---|---|---|---|
| 2003/0156400 A1* | 8/2003 | Dibene, II | ............... | G06F 1/18 |
| | | | | 361/803 |
| 2005/0072558 A1* | 4/2005 | Whitney | ............. | H01L 23/4006 |
| | | | | 165/80.3 |
| 2005/0248024 A1* | 11/2005 | Costello | ................ | H05K 1/141 |
| | | | | 257/691 |
| 2006/0262506 A1* | 11/2006 | Lee | ................... | H01L 23/4006 |
| | | | | 361/703 |
| 2006/0275100 A1* | 12/2006 | Aukzemas | ........... | F16B 37/145 |
| | | | | 411/353 |
| 2007/0217159 A1* | 9/2007 | Long | ................... | H01L 23/4093 |
| | | | | 361/704 |
| 2008/0050196 A1* | 2/2008 | Cao | ...................... | F16B 5/0266 |
| | | | | 411/107 |
| 2009/0168349 A1* | 7/2009 | Li | ...................... | H01L 23/4093 |
| | | | | 361/697 |
| 2010/0008048 A1* | 1/2010 | Urai | ................... | H01L 23/4006 |
| | | | | 361/717 |
| 2010/0053902 A1* | 3/2010 | Ma | ..................... | H01L 23/4006 |
| | | | | 361/709 |
| 2010/0243219 A1* | 9/2010 | Yang | .................. | H01L 23/4006 |
| | | | | 165/122 |
| 2013/0250523 A1* | 9/2013 | Lai | ..................... | H01L 23/4006 |
| | | | | 361/720 |
| 2015/0084182 A1* | 3/2015 | De Cecco | ............... | H01L 23/36 |
| | | | | 257/720 |
| 2019/0269005 A1* | 8/2019 | He | ..................... | H01L 23/4006 |

\* cited by examiner

HEAT-DISSIPATING MODULE HAVING AN ELASTIC MOUNTING STRUCTURE

BACKGROUND OF THE INVENTION

1. Field of the Invention

The present invention relates to an elastic mounting structure for a heat dissipating module, more particularly to an elastic mounting structure using elastic mounting components to provide stress buffer and good bonding effect for a thermally conductive device of the heat dissipating module bonded on an upper surface of a heat source device.

2. Description of the Related Art

With rapid development and growth of electronic technology in innovation, various types of computer devices such as personal computers, notebook computers, or tablet computers are popular in various applications and further developed with a trend of higher computing power, smaller volume, and lighter weight. Furthermore, industrial computers suitable for various industries are greatly developed along with rise of the open framework of computer equipment and the standardization of software and hardware, and the continuous expansions and upgrade of functions. The industrial computers are mainly applied in industrial control/automation equipment, network and communication equipment, image detection and recognition equipment, and intelligent transportation system, and also can be applied in higher-level application, such as military, transportation and aerospace fields, and other related industrial applications that require high reliability and high stability. In recent years, the industrial computers must meet specific specifications and perform high-efficiency operation in severe environment.

Generally, the various of industrial computers include, for example, single board computer (SBC), computer on module (COM), and backplane module (BPM). The computer on module (COM) includes a heat source component (CPU), a chipset, an input/output port (I/O port), and a built-in power supply, and can be combined with all system interfaces and functions through a memory module and a hard disk drive, so as to provide a plug-and-play (PNP) hardware platform and an expansion slot having additional function. Because of smaller size than the PC motherboard, the computer on module can be more flexibly applied in a variety of fixed and mobile embedded systems and industrial applications. However, since the computer on module has the small size and fast operation speed, the accumulated heat of the computer on module is more than the general motherboard. Therefore, the computer on module needs a better heat dissipation structure.

The conventional mounting manner used in the computer on module adopts a plurality of structural screws to tightly mount a heat dissipation module, the computer on module, and a carrier board, in series, and there are two types of mounting manners including the top mounting manner and the bottom mounting manner. In order to absorb the tolerance between the heat source component (such as a CPU) and the heat dissipating module, a thermal pad is used as a tolerance buffer between the heat dissipating module and the heat source component. Because the thermal pad cannot be closely attached with the heat source component at the microscopic level, the thermal contact resistance between the heat dissipating module and the heat source component is increased, thereby affecting the overall heat dissipation effect. Therefore, the conventional heat dissipating structure has great disadvantages. Furthermore, thermal paste can be used as the thermally conductive material between the heat dissipating module and the heat source component to reduce the thermal contact resistance but fail to provide the stress buffer between the heat dissipating module and the heat source component, and the heat dissipating module is easy to depart from the heat source component subject to the external vibration stress and fails to dissipate heat generated by the heat source component. Therefore, how to use the thermal paste to serve as the thermally conductive material and also provide stress buffer, is a key issue in the industry.

SUMMARY OF THE INVENTION

In order to solve above-mentioned problem, the inventor develops an elastic mounting structure for a heat dissipating module according to collected data, multiple tests and modifications, and years of experience in the industry.

An objective of the present invention is to provide a heat-dissipating module having an elastic mounting structure comprises a carrier circuit board, a main circuit board, a heat dissipating module and a plurality of elastic mounting components. The plurality of elastic mounting components are configured to mount a plurality of mounting holes of the carrier circuit board with a plurality of mounting grooves of the heat dissipating module in series, so as to fix the carrier circuit board, the main circuit board and the heat dissipating module. As a result, the plurality of elastic mounting components can provide stress buffer and good bonding effect for the thermally conductive device of the heat dissipating module bonded on an upper surface of the heat source device.

Another objective of the present invention is that a thermal paste can be coated or a phase change material can be attached between the thermally conductive device of the heat dissipating module and the upper surface of the heat source device, for thermal conduction.

Another objective of the present invention is that a polygonal head part of the elastic mounting component can be hexagonal, and a mounting groove for accommodating the elastic mounting component can be also a hexagonal space, so that outer edges of the hexagonal head part of the elastic mounting component can be fixed in the mounting groove.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
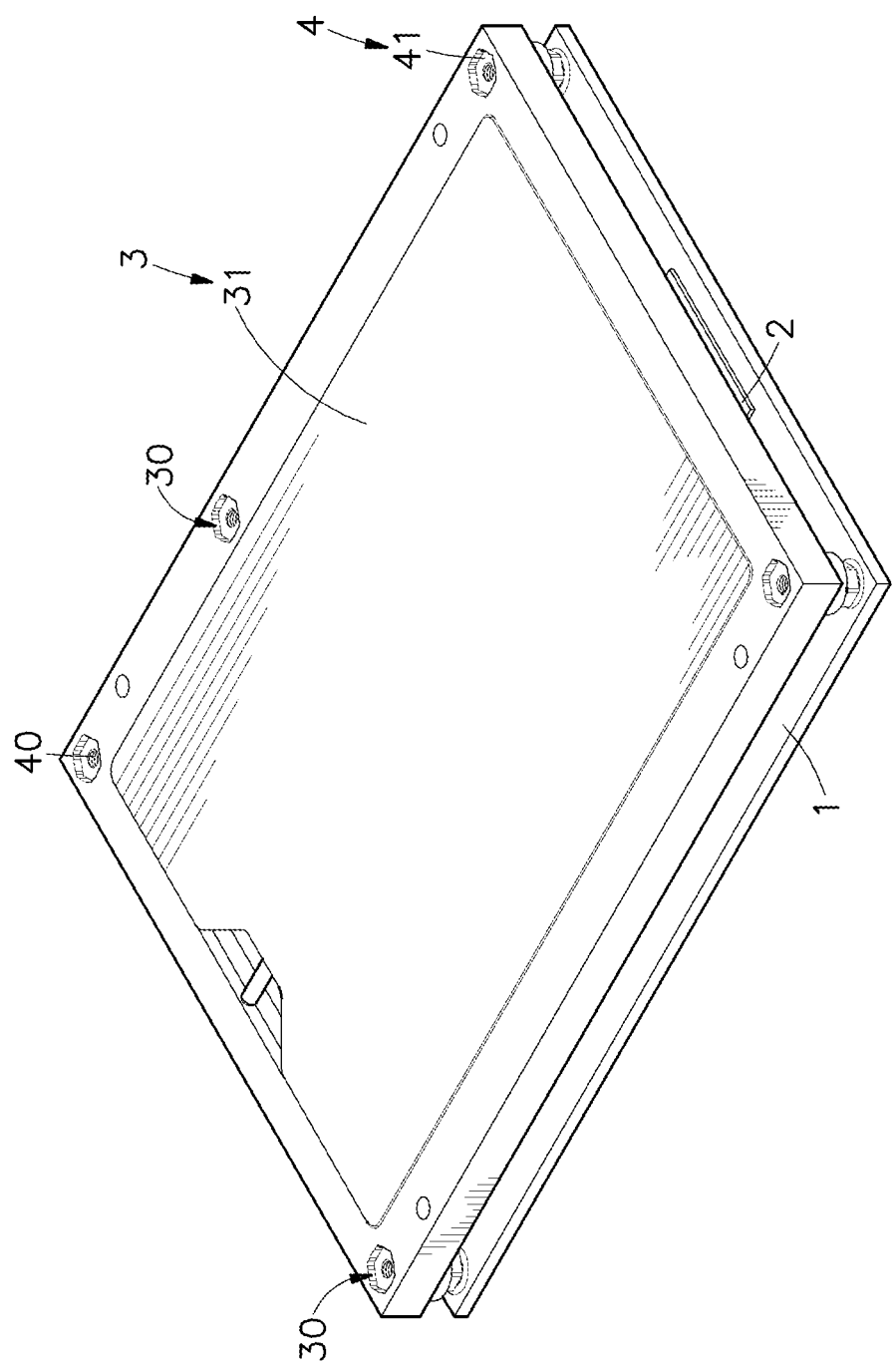
FIG. 1 is a perspective structural diagram of the heat-dissipating module having an elastic mounting structure according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 2:
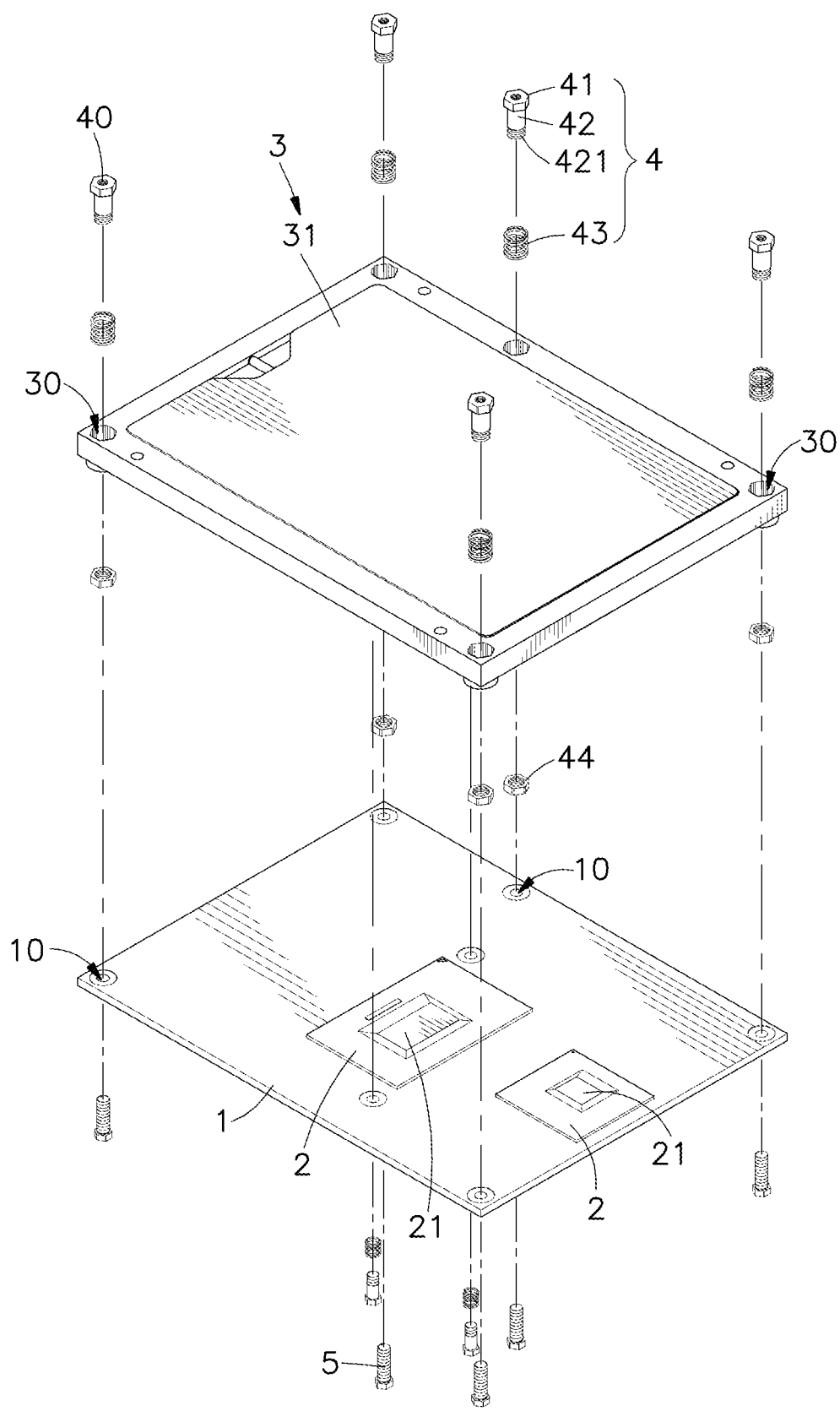
FIG. 2 is a perspective exploded structural diagram of the heat-dissipating module having an elastic mounting structure according to the present invention.
Figure 3:
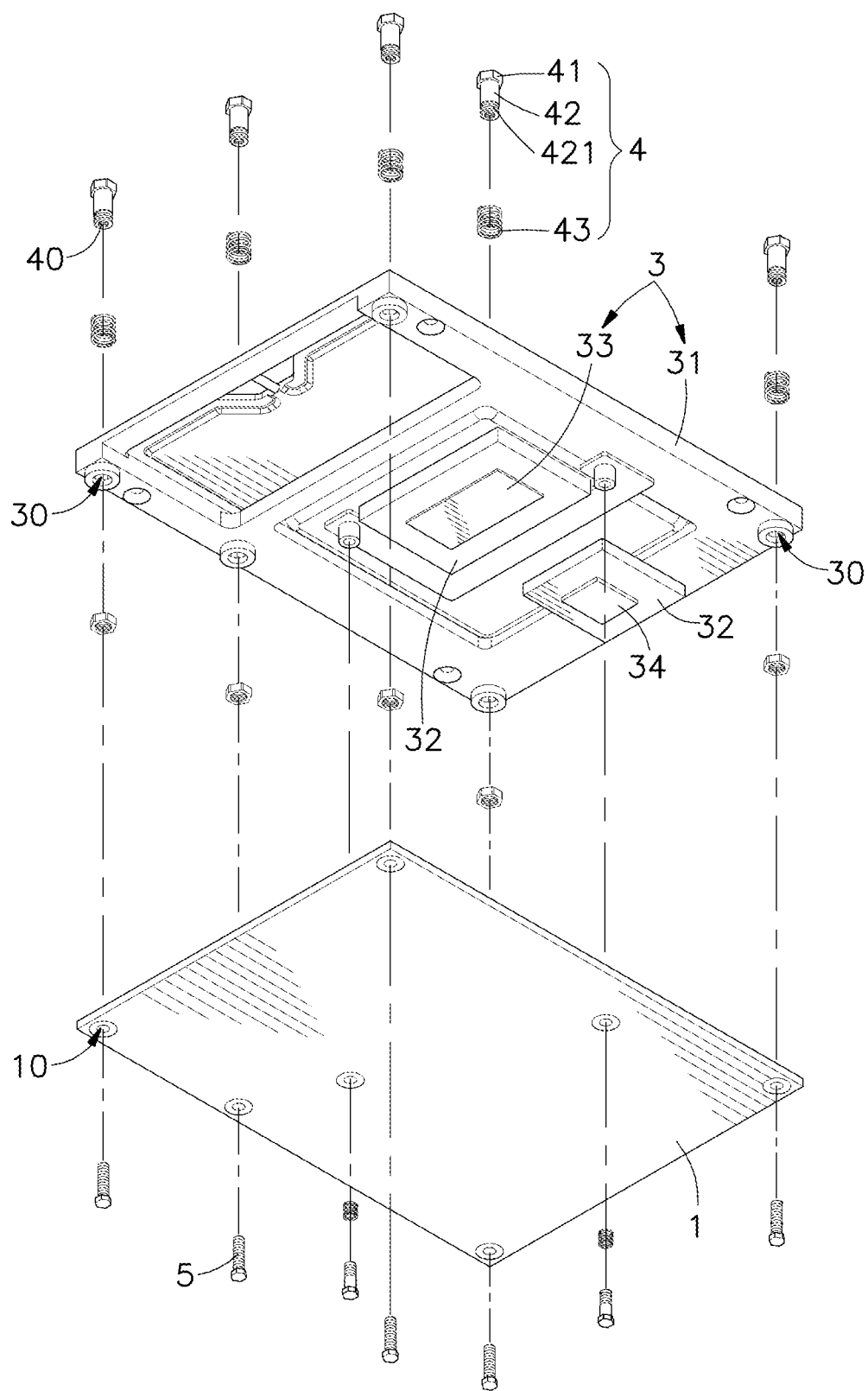
FIG. 3 is another perspective exploded structural diagram of the heat-dissipating module having an elastic mounting structure according to the present invention.
Figure 4:
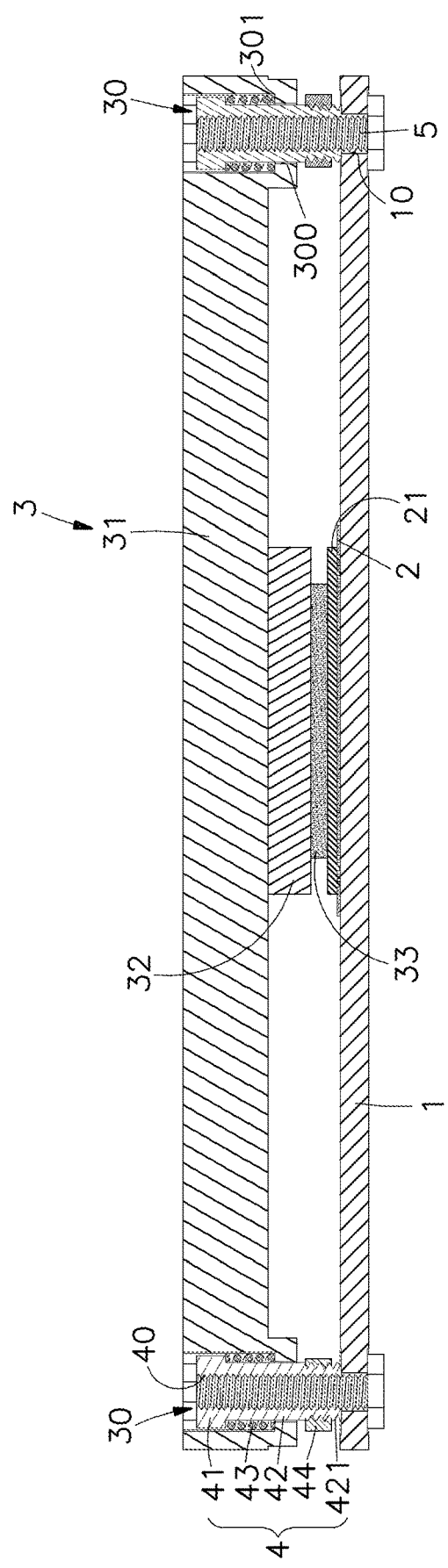
FIG. 4 is a structural diagram of a side cross-section of a heat-dissipating module having an elastic mounting structure according to the present invention.
Figure 5:
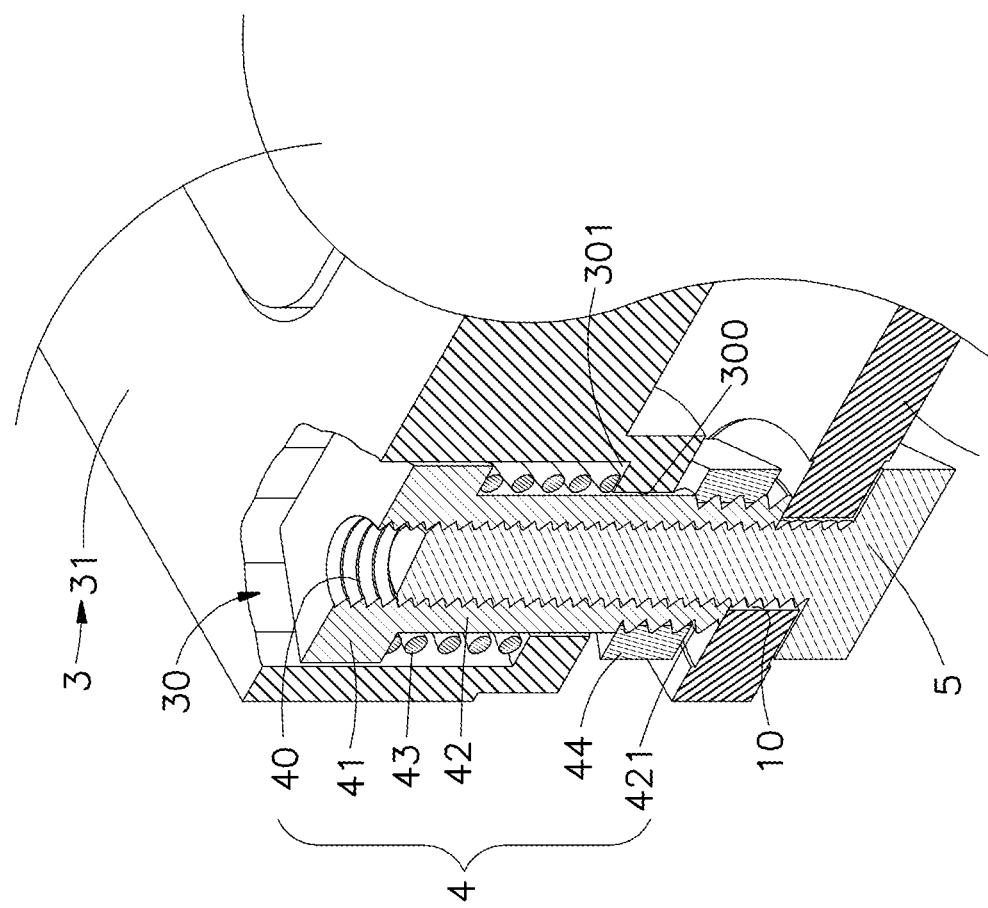
FIG. 5 is a perspective structural diagram of a cross section of a mounting groove according to the present invention.

Please refer to FIGS. 1 to 5, which show a perspective structural diagram of a heat-dissipating module having an elastic mounting structure, perspective exploded structural diagrams of the a heat-dissipating module having an elastic mounting structure, a structural diagram of side cross section of the a heat-dissipating module having an elastic mounting structure, and a perspective structural diagram of a cross section of a mounting groove according to the present invention, respectively. The a heat-dissipating module having an elastic mounting structure includes a carrier circuit board 1, a main circuit board 2, a heat dissipating module 3, an elastic mounting component 4 and a structural screw 5. The structural connections of components of the a heat-dissipating module having an elastic mounting structure are described in reference with FIGS. 1 to 5.

The carrier circuit board 1 can comprise a plurality of mounting holes 10.

The main circuit board 2 is disposed on and electrically connected to the carrier circuit board 1, and comprises at least one heat source device 21.

The heat dissipating module 3 is disposed on the main circuit board 2, and comprises at least one heat exchange device 31, a plurality of thermally conductive devices 32 and a plurality of mounting grooves 30. Each of the plurality of thermally conductive devices 32 has a surface configured to bond on a surface of the heat exchange device 31, and the other surface configured to bond on an upper surface of the heat source device 21 of the main circuit board 2. Each of the plurality of mounting grooves 30 has a stop part 301 disposed on a bottom thereof, and a through hole 300 formed on a central part of the stop part 301. In an embodiment, for thermal conduction, a thermal paste 33 can be coated between or a phase change material 34 can be attached between the thermally conductive device 32 of the heat dissipating module 3 and the upper surface of the heat source device 21. In a preferred embodiment of the present invention, the heat exchange device 31 can be a vapor chamber or a heat sink. In a preferred embodiment of the present invention, the thermally conductive device 32 can be a copper block. The heat source device 21 can be a central processing unit (CPU) or a chipset easy to heat, such as north and south bridge chips, or a power chip.

The plurality of elastic mounting components 4 are mounted in the plurality of mounting holes 10 of the carrier circuit board 1 and the through holes 300 of the mounting grooves 30 of the heat dissipating module 3 in series, so as to fix the carrier circuit board 1, the main circuit board 2 and the heat dissipating module 3. Each of the elastic mounting components 4 has a polygonal head part 41, a rod 42, an inner thread 40, and an elastic member 43. The inner thread 40 penetrates through the polygonal head part 41 and the rod 42, and is configured to screw with the structural screw 5. The elastic member 43 is disposed outside the rod 42. In a preferred embodiment of the present invention, the elastic member 43 can be a spring, and two ends of the elastic member 43 are abutted between the polygonal head part 41 and the stop part 301 of the mounting groove 30, respectively. The rod 42 has a constraining member 44 disposed on a part thereof exposed out of the through hole 300 of the mounting groove 30. The plurality of elastic mounting components 4 can provide stress buffer and good bonding effect for the thermally conductive device 32 of the heat dissipating module 3 bonded on the upper surface of the heat source device 21.

In a preferred embodiment, the polygonal head part 41 of the elastic mounting component 4 can be hexagonal, and the mounting groove 30 for accommodating the elastic mounting component 4 can be a hexagonal space, so that outer edges of the hexagonal head part of the elastic mounting component 4 can be fixed in the mounting groove 30 and below the upper edge of the mounting groove 30. The rod 42 of the elastic mounting component 4 has an outer thread 421 formed on an end surface thereof. The inner thread 40 formed on the end of the rod 42 of the elastic mounting component 4 can be screwed with the structural screw 5.

In an embodiment, the constraining member 44 can be formed by a nut, an O-ring or an E-ring. The constraining member 44 can constrain the elastic mounting component 4 in the mounting groove 30 of the heat dissipating module 3.

The difference between the heat-dissipating module having an elastic mounting structure of the present invention and conventional mounting structure is that the mounting groove 30 of the heat dissipating module 3 has a hexagonal space, and the elastic mounting component 4 includes the polygonal head part 41 which is also hexagonal, the rod 42, and the inner thread 40 penetrating through central portions of the polygonal head part 41 and the rod 42, and the constraining member 44, such as the nut, the O-ring or the E-ring, can prevent the polygonal head part 41 and the rod 42 from departing from the mounting groove 30. As a result, the polygonal head part 41 of the elastic mounting component 4 is constrained in the polygonal mounting groove 30 of the heat dissipating module 3 and unable to rotate, thereby forming a fixed structure. By using aforementioned members, the carrier circuit board 1, the main circuit board 2 and the heat dissipating module 3 can be mounted in series but not too tightly, so that the elastic members 43 disposed outside the elastic mounting components 4 can absorb assembly tolerance and apply a certain pressure on the surface of the heat source device 21 to tight combine with the heat dissipating module 3. Furthermore, the thermal paste 33 can be coated between or the phase change material 34 can be attached between the thermally conductive device 32 of the heat dissipating module 3 and the upper surface of the heat source device 21 where the thermally conductive device 32 is bonded, for thermal conduction, so as to reduce thermal contact resistance and improve heat dissipation effect. Without changing the mounting holes and mounting structures of the original carrier circuit board 1, the main circuit board 2 and the heat dissipating module 3, the heat-dissipating module having an elastic mounting structure of the present invention can solve, at the lowest cost, the problem that the bonding surfaces between the heat dissipating module 3 and the heat source device 21 are not elastic and the heat dissipating module 3 and the heat source device 21 cannot be tightly bonded with each other because of large tolerance.

As shown in FIGS. 1 to 5, the present invention mainly provides the heat-dissipating module having an elastic mounting structure comprises the carrier circuit board, the main circuit board, the heat dissipating module and the plurality of elastic mounting components, and the plurality of elastic mounting components are configured to mount the plurality of mounting holes of the carrier circuit board and the mounting grooves of the heat dissipating module in series, so as to fix the carrier circuit board, the main circuit board and the heat dissipating module; the plurality of elastic mounting components can provide stress buffer and good bonding effect between the thermally conductive device of the heat dissipating module and the upper surface of the heat source device. The present invention can be applied to solve that conventional problem occurs when the heat dissipating module is attached with the heat source device.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A heat-dissipating module having an elastic mounting structure, comprising:
   a carrier circuit board comprising a plurality of mounting holes;
   a main circuit board disposed on and electrically connected to the carrier circuit board, and comprising at least one heat source device;
   a heat dissipating module disposed on the main circuit board, and comprising at least one heat exchange device, a plurality of thermally conductive devices and a plurality of mounting grooves, wherein each of the plurality of thermally conductive devices has a surface bonded on a surface of the heat exchange device, and the other surface bonded on an upper surface of the heat source device of the main circuit board, and each of the plurality of mounting grooves includes a stop part disposed on a bottom thereof, and a through hole formed on a central part of the stop part; and
   a plurality of elastic mounting components configured to mount the plurality of mounting holes of the carrier circuit board and the through holes of the plurality of mounting grooves of the heat dissipating module in series, so as to fix the carrier circuit board, the main circuit board and the heat dissipating module, wherein each of the plurality of elastic mounting components has a polygonal head part, a rod, an elastic member, and an inner thread penetrating through central parts of the polygonal head part and the rod, wherein the inner thread is configured to screw with a structural screw, and the elastic member is disposed outside the rod, two ends of the elastic member are abutted between the polygonal head part and the stop part of the mounting groove, respectively, and the rod has a constraining member disposed on a part thereof exposed out of the through hole of each of the plurality of mounting grooves, and the plurality of elastic mounting components provide stress buffer and good bonding effect for the thermally conductive device of the heat dissipating module bonded on the upper surface of the heat source device.

2. The heat-dissipating module having an elastic mounting structure according to claim 1, further comprising a thermal paste coated between or a phase change material attached between the thermally conductive device of the heat dissipating module and the upper surface of the heat source device, for thermal conduction.

3. The heat-dissipating module having an elastic mounting structure according to claim 1, wherein the polygonal head part of each of the plurality of elastic mounting components is hexagonal, and each of the plurality of mounting grooves for accommodating one of the plurality of elastic mounting components is a hexagonal space, and outer edges of the hexagonal head part of each of the plurality of elastic mounting components are fixed in the mounting groove and below the upper edge of the mounting groove.

4. The heat-dissipating module having an elastic mounting structure according to claim 1, wherein the rod of each of the plurality of elastic mounting components has an outer thread formed on an end surface thereof.

5. The heat-dissipating module having an elastic mounting structure according to claim 1, wherein the constraining member is formed by a nut, an O-ring or an E-ring, and the constraining members constrain the plurality of elastic mounting components in the plurality of mounting grooves of the heat dissipating module, respectively.

6. The heat-dissipating module having an elastic mounting structure according to claim 1, wherein the elastic member is a spring.

7. The heat-dissipating module having an elastic mounting structure according to claim 1, wherein the heat exchange device is a vapor chamber or a heatsink.

8. The heat-dissipating module having an elastic mounting structure according to claim 1, wherein the thermally conductive device is a copper block.

9. The heat-dissipating module having an elastic mounting structure according to claim 1, wherein the inner thread formed on the end of the rod of the elastic mounting component is screwed with the structural screw.

10. The heat-dissipating module having an elastic mounting structure according to claim 1, wherein the heat source device is a central processing unit, or a chipset easy to heat.

* * * * *